United States Patent
Thylen et al.

(10) Patent No.: US 9,013,784 B2
(45) Date of Patent: Apr. 21, 2015

(54) NANOPARTICLE WAVEGUIDE APPARATUS, SYSTEM AND METHOD

(75) Inventors: Lars H. Thylen, Huddinge (SE); Alexandre M. Bratkovski, Mountain View, CA (US); Petter Holmstrom, Stockholm (SE)

(73) Assignee: Hewlett-Packard Development Company, L.P., Houston, TX (US)

( * ) Notice: Subject to any disclaimer, the term of this patent is extended or adjusted under 35 U.S.C. 154(b) by 48 days.

(21) Appl. No.: 13/881,195

(22) PCT Filed: Oct. 29, 2010

(86) PCT No.: PCT/US2010/054878
§ 371 (c)(1),
(2), (4) Date: Apr. 24, 2013

(87) PCT Pub. No.: WO2012/057802
PCT Pub. Date: May 3, 2012

(65) Prior Publication Data
US 2013/0215495 A1 Aug. 22, 2013

(51) Int. Cl.
*G02B 6/125* (2006.01)
*G02B 6/10* (2006.01)
(Continued)

(52) U.S. Cl.
CPC .............. *G02B 6/125* (2013.01); *G02B 6/107* (2013.01); *G02B 6/1226* (2013.01); *H01S 3/063* (2013.01); *H01S 3/169* (2013.01); *H01S 5/3412* (2013.01); *B82Y 20/00* (2013.01); *G02B 6/262* (2013.01); *Y10S 977/784* (2013.01);
(Continued)

(58) Field of Classification Search
CPC ...... G02B 6/125; G02B 6/107; G02B 6/1226; G02B 6/262; H01S 3/63; H01S 3/169; H01S 5/3412; B82Y 20/00; Y10S 977/784; Y10S 977/786; Y10S 977/902; G02F 1/126; G02F 2203/10
See application file for complete search history.

(56) References Cited

U.S. PATENT DOCUMENTS 6,441,945 B1 * 8/2002 Atwater et al. ............... 359/296
6,685,986 B2 2/2004 Oldenburg et al.
(Continued)

FOREIGN PATENT DOCUMENTS

WO WO-2007103077 9/2007

OTHER PUBLICATIONS

Atwater et al., "The New "p-n Junction": Plasmonics Enables Photonic Access to the Nanoworld," MRS Bulletin, vol. 30, May 2005, pp. 385-389.
(Continued)

Primary Examiner — Ari M Diacou
(74) Attorney, Agent, or Firm — North Shore Associates

(57) ABSTRACT

A nanoparticle waveguide apparatus, a nanoparticle waveguide photonic system and a method of photonic transmission employ a nearfield-coupled nanoparticle (NCN) waveguide to cooperatively propagate an optical signal. The nanoparticle waveguide apparatus includes a first optical waveguide adjacent to a second optical waveguide, the first optical waveguide comprising an NCN waveguide having a plurality of nanoparticles. The nanoparticle waveguide photonic system further includes a nearfield coupling (NC) modulator. The method includes providing the NCN waveguides and modulating a coupling between one or both of first and second NCN waveguides and adjacent nanoparticles within one or both of the first and second NCN waveguides.

14 Claims, 4 Drawing Sheets

(51) Int. Cl.
| | |
|---|---|
| H01S 3/063 | (2006.01) |
| H01S 3/16 | (2006.01) |
| B82Y 20/00 | (2011.01) |
| G02B 6/26 | (2006.01) |
| G02F 1/01 | (2006.01) |
| G02B 6/122 | (2006.01) |
| H01S 5/34 | (2006.01) |

(52) U.S. Cl.
   CPC .......... *Y10S 977/786* (2013.01); *Y10S 977/902* (2013.01); *G02F 1/0126* (2013.01); *G02F 2203/10* (2013.01)

(56) References Cited

U.S. PATENT DOCUMENTS

| | | | |
|---|---|---|---|
| 6,699,724 | B1 | 3/2004 | West et al. |
| 7,010,183 | B2 | 3/2006 | Estes et al. |
| 7,358,525 | B2 | 4/2008 | Lee |
| 7,587,107 | B2 | 9/2009 | Hyde et al. |
| 7,706,660 | B2 * | 4/2010 | Lin et al. ............... 385/143 |
| 8,216,518 | B2 * | 7/2012 | Chau et al. ............. 422/82.11 |
| 2003/0162587 | A1 * | 8/2003 | Tanamoto et al. ........... 463/22 |
| 2004/0155184 | A1 | 8/2004 | Stockman et al. |
| 2008/0066549 | A1 * | 3/2008 | Oldham et al. ............. 73/579 |
| 2008/0085088 | A1 * | 4/2008 | Lin et al. ............... 385/130 |
| 2008/0089367 | A1 * | 4/2008 | Srinivasan et al. ........... 372/19 |
| 2011/0081109 | A1 * | 4/2011 | Thylen et al. ............. 385/30 |
| 2013/0181171 | A1 * | 7/2013 | Ratna et al. ............. 252/501.1 |

OTHER PUBLICATIONS

Atwater, "Guiding Light," Micro/Nano Lithography & Fabrication, oemagazine, Jul. 2002, pp. 1-6.

Bustos-Marun, Raul A. et al. Buffering plasmons in nanoparticle waveguides a t the virtual-localized transition. Physical Review B. Jul. 2010, vol. 82 Issue 3, pp. 035434-1 to 6. See abstract; figure 1.

Caro et al., "Silver nanoparticles: sensing and imaging applications," Silver Nanoparticles, InTech, Publishing, Mar. 2010, pp. 201-224.

Dionne et al., "Planar metal plasmon waveguides: frequency-dependent dispersion, propagation, localization, and loss beyond the free electron model," Physical Review B 72, 075405, 2005, pp. 075405-1 to 075405.

International Search Report, Jul. 27, 2011, PCT Application No. PCT/US2010/054878.

Koenderink, et al. "Experimental evidence for large dynamic effects on the plasmon dispersion of subwavelength metal nanoparticle waveguides." Physical Review B. Nov. 2007, vol. 76, No. 20, pp. 201403-1 to 4.

Krenn, Joachim R. Nanoparticle waveguides: Watching energy transfer. Nature Materials. Apr. 2003, vol. 2, pp. 210-211. See abstract; figure 1.

Maier et al., "Electromagnetic energy transport below the diffraction limit in periodic metal nanostructures," Proc. of SPIE vol. 4456, Dec. 5, 2001, pp. 22-30.

Maier et al., "Observation of coupled plasmon-polariton modes in Au nanoparticle chain waveguides of different lengths: Estimation of waveguide loss," Applied Physics Letters, vol. 81, No. 9, Aug. 2002, pp. 1714-1716.

Maier et al., "Plasmonics: Localization and guiding of electromagnetic energy in metal/dielectric structures," Applied Physics Reviews—Focused Review, Journal of Applied Physics vol. 98, 011101, 2005, pp. 011101-1 to 011101-10.

Maier et al., "PlasmonicsÐA A Route to Nanoscale Optical Devices," Adv. Mater. 2001, vol. 13, No. 19, Oct. 2001, pp. 1501-1505.

Maier, "Energy transport in metal nanoparticle plasmon waveguides," Mat. Res. Soc. Symp. Proc., vol. 777, 2003, pp. T7.1.1-T7.1.12.

Nedyalkov et al., "Near-field properties of a gold nanoparticle array on different substrates excited by a femtosecond laser," Nanotechnology, vol. 18, 305703, 2007, pp. 1-7.

Neeves et al., "Composite structures for the enhancement of nonlinear-optical susceptibility," J. Opt. Soc. Am. B, vol. 6, No. 4, Apr. 1989, 787-796.

Noginov et al., "Compensation of loss in propagating surface plasmon polariton by gain in adjacent dielectric medium," Optics Express, vol. 16, No. 2, Jan. 21, 2008, pp. 1385-1392.

Noginov et al., "Demonstration of a spaser-based nanolaser," Nature Letters, vol. 460, No. 27, Aug. 2009, pp. 1110-1113.

Oulton et al., "A hybrid plasmonic waveguide for subwavelength confinement and long-range propagation," Nature Photonics, vol. 2, Aug. 2008, pp. 496-500.

Perahia et al., "Surface-plasmon mode hybridization in sub-wavelength microdisk lasers," arXiv:0908.3515v1 [physics.optics], submitted Aug. 25, 2009, pp. 1-4.

Ponizovskaya et al., "Binary metal and semiconductor quantum dot metamaterials with negative optical dielectric constant and compensated loss for small volume waveguides, modulators and switches," Appl Phys A, vol. 95, 2009, pp. 1029-1032.

Prabhathan et al., "Compact SOI nanowire refractive index sensor using phase shifted Bragg grating," Optics Express, vol. 17, No. 17, Aug. 2009, pp. 15330-15341.

Stockman, "Spasers explained," Nature Photonics, vol. 2, Jun. 2008, pp. 327-329.

Yang, Tian et al. Surface plasmon coupling in periodic metallic nanoparticle structures: a semi-analytical model. Optics Express. Aug. 2008, vol. 16 Issue 17, pp. 13070-13079. See abstract; p. 13072 line 8-p. 13073 line 3; figure 1.

* cited by examiner

NANOPARTICLE WAVEGUIDE APPARATUS, SYSTEM AND METHOD

CROSS-REFERENCE TO RELATED APPLICATIONS

N/A

STATEMENT REGARDING FEDERALLY SPONSORED RESEARCH OR DEVELOPMENT

N/A

BACKGROUND

Development in the area of integrated photonics with applications in optical interconnects, sensors, biotechnology and telecommunications has followed a path similar to that of integrated circuits. The size and costs of integrated photonic components have generally decreased concomitant with a general increase in complexity and functionality of these components as well as in the photonic systems in which the components are employed. In particular, considerable effort in the past several decades has been devoted to making improvements in all aspects of integrated photonics including reduced size or footprint, increased functionality, lower power dissipation and low cost.

A major advancement in integrated photonics in recent years has been the development and use of so-called "metal optics." The term "metal optics" here generally refers to the use of optical modes bound or confined to an interface between a surface of a material with a negative dielectric constant (e.g., a metal or a doped semiconductor that may show a plasma-like response to an incident electromagnetic wave) and one of a vacuum or a material with a positive dielectric constant. These bound optical modes are also referred to as surface plasmons or surface plasmon polaritons (SPP).

Chief among the promises of metal optics is the use of the bound optical modes in realizing and implementing sub-wavelength photonic devices and structures (e.g., nanoscale integrated photonics). However, a problem that faces the use of metal optics is the realization of practical components using such constructs.

BRIEF DESCRIPTION OF THE DRAWINGS

The various features of examples may be more readily understood with reference to the following detailed description taken in conjunction with the accompanying drawings, where like reference numerals designate like structural elements, and in which.

Figure 1A:
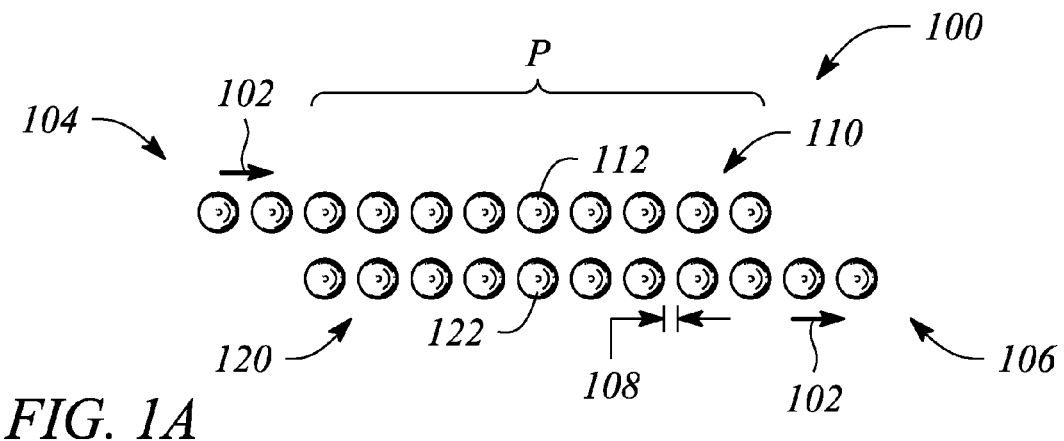
FIG. 1A illustrates a top view of a nanoparticle waveguide apparatus, according to an example.

Certain examples have other features that are one of in addition to and in lieu of the features illustrated in the above-referenced figures. These and other features are detailed below with reference to the preceding drawings.

DETAILED DESCRIPTION

Examples provide a nanoscale photonic functionality using nearfield coupled nanoparticle waveguides. In particular, nanoparticles may be arranged in a row as a nearfield-coupled nanoparticle (NCN) waveguide. In turn, one or more of the NCN waveguides may be arranged, in some examples with a conventional optical waveguide, to provide various functions. For example, a plurality of NCN waveguides may facilitate realization of a wide variety of complex photonic devices and systems including, but not limited to, Y-junctions, X-junctions, waveguide loop or ring structures, directional couplers, multiplexers and Mach-Zehnder interferometers. Further, the nanoparticles of the nanoparticle waveguide may be individually tuned or otherwise configured to affect realization of frequency dependent or frequency tailored devices such as filters, for example. Moreover, in various examples the photonic devices may be employed as sensors to detect analytes within an environment of the photonic device.

Herein, a nearfield-coupled nanoparticle (NCN) waveguide is defined as a plurality of nanoparticles arranged adjacent to one another to form a photonic waveguide. In some examples, the nanoparticles are adjacent to one another in a linear array or 'row'. In some examples, the row comprises the nanoparticles arranged singly next to one another. In other examples, the nanoparticles may be arranged as a row of doublets, triplets, and so on. In yet other examples, the row may comprise a plurality of adjacent rows (e.g., parallel ones of a double row, a triple row, etc.) or even in more complex arrangements (e.g., a sheet or 2-dimensional array). As used herein, the term 'row' is defined to include both straight rows and curved or curvilinear rows, as described herein and further below. In addition, the definition of 'row' further includes rows that have or include a point of inflection or an abrupt change in direction. For example, the row of nanoparticles may describe a right bend or a Y-junction and still be considered a row.

Implicit in the definition of NCN waveguide is that individual ones of the nanoparticles are capable of supporting a surface plasmon on or within a surface of the nanoparticle. Further, propagation along the NCN waveguide is provided by nearfield coupling between the surface plasmons on adjacent nanoparticles of the NCN waveguide. In particular, the NCN waveguide is distinguished from other photonic waveguides including, but not limited to, other metal optics waveguides, in that the propagation is provided by the nearfield coupling of the surface plasmons.

As such, in operation, an optical signal propagates along the NCN waveguide from one nanoparticle to another. In particular, the nanoparticles of the nanoparticle photonic waveguide are optically coupled to one another primarily by near field coupling (e.g., by evanescent fields). A configuration of an optical field of the propagating optical signal is referred to as a mode. The NCN waveguide may support a plurality of modes of the propagating optical signal. Further, a surface of the nanoparticles of the NCN waveguide supports the propagating optical signal and the optical signal is effectively bound to one or both of the surface and an interior of the nanoparticle, depending on configuration, as the optical signal propagates from one nanoparticle to another along a length of the NCN waveguide, according to some examples. Specifically, the nanoparticle surface supports the propagating optical signal as a surface plasmon. The surface plasmon may be supported on an interface between the nanoparticle surface and a dielectric or free space region adjacent to the surface, for example.

According to various examples, the nanoparticle generally has a major radius that is less than about 100 nanometers (nm). In some examples, the major radius of the nanoparticle is less than about 50 nm. In some examples, the nanoparticle has a major radius that is between about 5 nm and about 40 nm (e.g., a major diameter of between 10 nm and 80 nm). For example, the nanoparticle may be about 10 nm in diameter (e.g., has a 5 nm major radius). In another example, the nanoparticle may have a 10 nm major radius. In another example, a first nanoparticle of the NCN waveguide may have a major radius that differs from a major radius of a second nanoparticle of the nanoparticle photonic waveguide.

In some examples, one or more of the nanoparticles is a composite nanoparticle that comprises an optical gain material (OGM). In some examples, the nanoparticles of the NCN photonic waveguide may be pumped to provide the optical gain. In some examples, the optical gain compensates for propagation loss in an optical signal of the photonic waveguide. The provided optical gain may facilitate longer propagation lengths than may be possible in other nanoscale photonic waveguides, for example. Additionally, the composite nanoparticle may allow a performance characteristic (e.g., nearfield coupling phase and magnitude, plasma frequency, etc.) to be adjusted in situ.

According to some examples, a composite nanoparticle of the NCN waveguide comprises a shell and a core. A surface of the shell is the surface of the composite nanoparticle and the surface supports the optical signal that propagates from one nanoparticle to another along the NCN waveguide. The core is adjacent to a side of the shell opposite the surface of the shell, in some examples. In some examples, the shell effectively surrounds the core. In other examples, the shell may surround only a portion of the core while another portion of the core is not surrounded or even adjacent to the shell.

The shell comprises a negative dielectric constant material (NDM) and the core comprises an optical gain material (OGM). The NDM of the shell supports the propagating optical signal at the shell surface (i.e., the NDM surface). The propagating optical signal couples to the OGM through the shell to produce stimulated emission in the OGM. In turn, the propagating optical signal is amplified by the stimulated emission. Coupling into the OGM occurs through or by way of a portion of an electromagnetic field of the propagating optical signal that penetrates into the core, according to some examples. The result is that the propagating signal effectively receives optical energy from the OGM and as such, experiences optical gain (i.e., is amplified).

In general, a thickness of the shell is chosen to facilitate, or in some examples optimize, the coupling between the optical signal propagating on a surface of the shell and an interior of the composite nanoparticle. In some examples, a wavelength of operation may be at or substantially detuned from a wavelength of maximum gain in the OGM. In other examples, the shell thickness is chosen to facilitate pumping of the OGM. For example, when optical pumping is used, the shell thickness (and perhaps other parameters) may be chosen to insure that sufficient optical energy from an external optical source (i.e., an optical pump) is able to penetrate the shell and pump the OGM of the composite nanoparticle. By 'sufficient optical energy' it is meant that the optical energy is sufficient to establish a population inversion in the OGM that enables stimulated emission. In some examples, the shell has a thickness that is generally less than about one half the major radius of the composite nanoparticle. In some examples, the shell thickness is less than about 10 nm. In some examples, the shell thickness is between about 0.5 nm and about 10 nm.

In other examples, materials of the core and shell are substantially reversed. In particular, the core comprises the NDM while the shell comprises the OGM. In these examples, the optical signal is supported by a surface of the NDM core that is adjacent to the OGM shell. In yet other examples, the composite nanoparticle comprises additional layers or shells. For example, the composite nanoparticle may have an OGM, a first shell comprising NDM and a second shell comprising OGM, the second shell surrounding the first shell, in whole or in part.

In yet other examples, the OGM of the composite nanoparticle may be a material (e.g., host material) that one or more of immerses, suspends and surrounds a nanoparticle of an NCN waveguide. For example, the nanoparticles may be immersed in a liquid OGM. In another example, a solid material that suspends the nanoparticles functions as the OGM. In yet other examples, a composite nanoparticle comprising a core and shell that includes an OGM, for example, may be further surrounded by an OGM. In some examples, the surrounding material may be populated by semiconducting nanoparticles that provide gain. The surrounding OGM may be either different from or substantially similar to the OGM of the core/shell. In all of these examples, the nanoparticle in the OGM is defined as a composite nanoparticle. In other words, by definition herein, a composite nanoparticle may comprise a nanoparticle that is substantially surrounded by the OGM. Moreover by definition herein, the composite nanoparticle may comprise a composite nanoparticle that is further surrounded by the OGM.

Herein, the term 'negative dielectric constant material (NDM)' is defined as a material that has a dielectric constant that is less than zero. In particular, the NDM is defined as a material with a dielectric constant that is negative valued for at least some range of frequencies. The NDM used for the shell of the composite nanoparticle has a negative dielectric constant at a frequency of the propagating optical signal traveling on the nanoparticle photonic waveguide. For example, the NDM may be a metal such as, but not limited to noble metals. For example, the NDM may comprise silver (Ag) or gold (Au). Explicitly included in the definition of NDM herein are composite materials, also known as metamaterials, which exhibit a negative dielectric constant that is one or both due to a particular combination of materials used to realize the composite material and due to a physical structure (e.g., periodic arrangement) of the materials used. It should be noted that while described above with respect to composite nanoparticles, nanoparticles of the NCN waveguide other than the composite nanoparticle also comprise the NDM surface that is either a surface of a shell of the nanoparticle or a surface of a material of the nanoparticle itself.

Herein, the 'optical gain material (OGM)' is defined as a material that provides optical gain to the propagating optical signal. In particular, the OGM provides the optical gain through stimulated emission within the OGM. In general, the OGM may be any material that produces stimulated emission when pumped by one or both of an electrical means (i.e., an electrical pump) and an optical means (i.e., optical pump). As such, candidate materials for the OGM of the core may include any laser material. For example, the OGM may comprise a laser material including, but not limited to, semiconductors, semiconductor quantum well/shell structures, erbium doped silica glass, ruby (i.e., chromium doped aluminum oxide) and organic dyes.

In some examples, the OGM may comprise a semiconductor. In general, both semiconductors that exhibit a direct band gap and semiconductors that exhibit an indirect bandgap may be used. However, direct bandgap semiconductors may produce much higher optical gain, according to some examples. In some examples, the semiconductor may be undoped (e.g., effectively intrinsic) or doped such that no semiconductor junction is present. In some of these examples, heterostructures may be employed. A heterostructure is a layered semiconductor that comprises layers or shells of different semiconductor materials (e.g., see discussion below). In other examples, the semiconductor may be doped to form a semiconductor junction (e.g., a diode junction). For example, the semiconductor junction may be biased by an electrical source (i.e., the electrical pump) to provide stimulated emission when coupled to the propagating optical signal through the shell. In some examples, the semiconductor junction may employ a homojunction (i.e., using the same materials), while in other examples, a heterojunction (e.g., a quantum well structure) may be used. Examples of semiconductors that may be used as either a homojunction or a heterojunction to form the OGM include, but are not limited to, gallium arsenide (GaAs), indium gallium arsenide (InGaAs), and gallium nitride (GaN), as well as various other III-V, II-VI, and IV-VI compound semiconductors, and group IV compound or elemental semiconductors. Optical pumping may be used instead of or in addition to electrical pumping when the OGM comprises a semiconductor (e.g., with or without a semiconductor junction), according to some examples.

In some examples, the OGM of the core is a heterostructure semiconductor. In particular, the core may comprise a first layer comprising a first semiconductor having a first bandgap and a second layer comprising a second semiconductor having a second bandgap that is larger than the first bandgap. The second layer is located between the first layer and the shell. For example, the first layer may be an inner or central portion of the core and the second layer may either partially or completely surround the first layer. In other words, the first layer is effectively an inner core and the second layer is an outer core. The smaller or narrower bandgap of the first semiconductor material forms a potential well due to the bandgap difference. Excitons generated in the second semiconductor material may easily drift into the potential well. Moreover, photons generated by exciton annihilation within the first semiconductor during stimulated emission are not easily absorbed by the second semiconductor material and will pass more easily therethrough enhancing the optical gain. Example materials for the first/second semiconductors include, but are not limited to, cadmium selenide/zinc sulfide (CdSe/ZnS), cadmium telluride/zinc sulfide (CdTe/ZnS), cadmium sulfide/zinc sulfide (CdS/ZnS), lead selenide/lead sulfide (PbSe/PbS), indium phosphide/zinc sulfide (InP/ZnS), indium arsenide/cadmium selenide (InAs/CdSe), indium arsenide/indium phosphide (InAs/InP), indium arsenide/gallium arsenide (InAs/GaAs) and silicon/silicon dioxide (Si/SiO$_2$).

In other examples, the core comprises a material that provides stimulated emission or equivalently, may be induced into a state of population inversion, when exposed to an external optical signal from an optical pump. For example, various crystalline materials doped with either transition metal ions or rare-earth ions may be employed. Neodymium may be used to dope yttrium lithium fluoride (Nd:YLF), yttrium aluminum garnet (Nd:YAG) and yttrium orthovanadate (Nd:YVO$_4$), for example. Chromium may be used to dope corundum (i.e., aluminum oxide or Al$_2$O$_3$) to produce a ruby (Cr:Al$_2$O$_3$) and titanium may be used to dope sapphire (Ti:sapphire or Ti:Al$_2$O$_3$) for use as the OGM, for example. As another example organic dyes such as rhodamine may be used to dope organic host materials that serve or function as the OGM.

In some examples, the composite nanoparticle further comprises an insulator layer between the shell and the core. The insulator layer comprises an insulator material and provides electrical insulation between the shell and the core. As defined herein, an insulator material explicitly includes any material that is generally more insulative than conductive. In other words, materials other than pure or ideal insulators also may be employed to realize the insulator layer, according to the definition employed herein. For example, the insulator material may comprise a dielectric material. In another example, the insulator material may comprise a relatively resistive material such as an intrinsic or lightly doped semiconductor.

In various examples, a material of the insulator layer may be an oxide, a carbide, a nitride or an oxynitride of any of the above-referenced semiconductor materials such that insulating properties of the material are facilitated. For example, the insulator may be a silicon oxide (SiO$_x$). Alternatively, the insulator may comprise an oxide, a carbide, a nitride or an oxynitride of a metal (e.g., aluminum oxide) or even a combination of multiple, different materials to form a single insulating material or it may be formed from multiple layers of insulating materials.

Herein, the term 'pump' is explicitly defined as a source of energy used to induce population inversion in the OGM. Specifically, the pump provides energy to the OGM that raises electrons of the OGM to a higher energy state (e.g., excitons). The higher energy state electrons in the OGM eventually decay by way of one or both of spontaneous emission and stimulated emission, in addition to possible nonradiative recombination (e.g., as one or both of phonons and an Auger electron). An optical pump provides the energy to the OGM primarily through an optical means (e.g., light or electromagnetic radiation) while an electrical pump provides the energy primarily through an electrical means (e.g., an electric current). Generally, the pump that provides the energy to pump the OGM is separate from a source that provides the propagating optical signal, according to some examples.

Herein, the term "major radius" is defined as a radius of a circle that contains a nanoparticle or a selected cross section of the nanoparticle. In particular, the major radius defines a circle that contains a cross section of the nanoparticle, wherein the cross section is taken in a direction of propagation of the optical signal. For example, the major radius of a nanoparticle having a spherical shape is a radius of a sphere that contains the nanoparticle. Similarly, for an example nanoparticle having a hemispherical shape, the major radius is also a radius of a sphere that contains the nanoparticle. Example nanoparticles being cube-shaped have a major radius corresponding to a radius of a sphere that contains the cube-shaped nanoparticle. For an example nanoparticle having a rod-like shape (i.e., having one dimension that is much greater than two other dimensions), the major radius is defined as a radius of a circle that contains a cross section of the nanoparticle, wherein the cross section is taken perpendicular to a longitudinal axis of the rod-like shaped nanoparticle. Likewise, a nanoparticle having the shape of a pyramid would have a major radius that corresponds to a radius of a circle that enclosed a widest cross section of the nanoparticle perpendicular to an axis of the pyramidal shape extending from a tip of the pyramid to a base thereof. A 'major diameter' is defined as two times the major radius.

A 'semiconductor junction' as used herein refers to a junction formed within a semiconductor material between two differently doped regions thereof. For example, a junction between a p-doped region and an n-doped region of the semiconductor material is referred to as a p-n semiconductor junction or simply a p-n junction. The p-n junction includes asymmetrically doped semiconductor junctions such as, but not limited to, $p^+$-n junctions where '$p^+$' denotes a relatively higher concentration of the p-type dopant or impurity compared to the n-type dopant or impurity. A semiconductor junction in which an intrinsically doped region (i-region) lies between and separates the p-doped region (or 'p-region') and the n-doped region (or 'n-region') is generally referred to herein as a p-i-n semiconductor junction or simply a p-i-n junction. The term 'semiconductor junction' as used herein also refers to complex junctions that may include one or more of layers of different semiconductor materials (e.g., GaAs and GaAlAs), layers of different doping concentrations (e.g., p, $p^+$, $p^-$, $p^{++}$, n, $n^+$, $n^-$, $n^{++}$, i, etc.), and doping concentration gradients within and across layers. Further herein, an 'intrinsically' doped semiconductor or a related 'intrinsic' region/layer/semiconductor is defined as a semiconductor or semiconductor region having a doping concentration that is either undoped (e.g., not intentionally doped) or relatively lightly doped when compared to doping concentrations present in other layers or regions of the semiconductor junction (e.g., p-doped regions or n-doped regions).

Semiconductor junctions that join different semiconductor materials are defined and referred to herein as either 'heterostructure junctions' or simply 'heterojunctions'. For example, a layer of a first semiconductor material sandwiched between two adjacent layers of a second semiconductor material would be referred to as a heterojunction. Such a heterojunction, wherein the first semiconductor material has a first bandgap and the second semiconductor material has a second band gap, the first bandgap being lower than the second bandgap, is defined herein as a quantum well or a heterojunction quantum well. By way of distinction, a 'heterostructure' is defined herein as a structure comprising a plurality of different semiconductor materials arranged in adjacent layers where the adjacent layers are in intimate contact with one another.

Herein, no distinction is made between various specific types of junctions (e.g., p-n, p-i-n, $p^+$-n, $p^{+-}$n, heterojunction, etc.) unless such distinction is necessary for proper understanding. Semiconductor junctions between an n-type semiconductor and a p-type semiconductor (of the same or of a different material) are also often referred to as 'diode junctions' whether or not an intrinsic layer separates the n-type doped and p-type doped semiconductors.

A 'surface plasmon' is defined herein as a surface wave or plasma oscillation of a two-dimensional free electron gas (2DEG) within a surface of an NDM at an interface between the NDM and a dielectric or a vacuum. The surface plasmon may also be considered as an electromagnetic wave that is highly localized near the interface, accompanied by coupled collective oscillations of the free electron gas in the NDM surface. The surface plasmon may be induced or excited by an incident electromagnetic (EM) wave at optical frequencies, for example. The excitement of a surface plasmon by an incident EM wave is referred to as 'plasmonic excitation.'

When considering surface plasmons on particles (e.g., nanoparticle) that are relatively small, the surface plasmons may be more properly termed localized surface plasmons or localized surface plasmon polaritons (LSPP). A field associated with the LSPP is highly localized at and sometimes within the relatively small particle. In some examples that involve small particles with diameters or an overall size that is less than, and in some instance much less than, a wavelength of the incident EM wave (i.e., nanoparticles), more electrons in the NDM than just the free electron gas at the NDM surface may be involved or participate in plasmonic excitation. For example, for a nanoparticle that is much smaller than the wavelength of the EM wave, substantially all of the electrons in the nanoparticle may be involved in the plasmonic excitation. In such instances, the plasmonic excitation may be referred to as a giant dipole resonance (i.e., collective oscillations of a whole electron density across the nanoparticle as a quasi-static resonance) or a Fröhlich resonance.

Furthermore, characteristics of surface plasmons may be referred to in terms of plasmonic modes. In particular, plasmonic modes represent characteristics of surface plasmons in much the same way that electromagnetic oscillations are represented in terms of localized electromagnetic or optical modes. Surface plasmons and by extension, plasmonic modes, are usually confined to a surface of a material that supports surface plasmons. For example, an optical signal incident from a vacuum or a dielectric material on a surface of a surface plasmon supporting material may produce surface plasmons that propagate along the surface according to plasmonic modes. Recognizing that an effect of the size of a particle may be significant on a mode of the surface plasmon (or LSPP), herein the term 'surface plasmon' is employed interchangeably to also mean LSPP and giant dipole resonance for simplicity of discussion and not by way of limitation.

Further, as used herein, the article 'a' is intended to have its ordinary meaning in the patent arts, namely 'one or more'. For example, 'a nanoparticle' means one or more nanoparticles and as such, 'the nanoparticle' means 'the nanoparticle(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means plus or minus 10% unless otherwise expressly specified. Moreover, examples herein are intended to be illustrative only and are presented for discussion purposes and not by way of limitation.

Figure 1B:
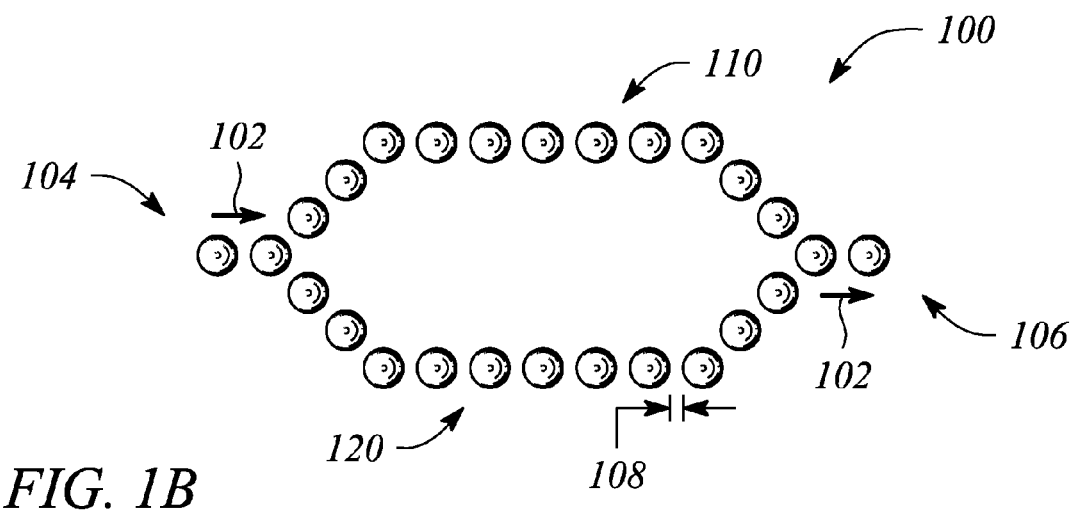
FIG. 1B illustrates a top view of a nanoparticle waveguide apparatus, according to another example.

FIG. 1A illustrates a top view of a nanoparticle waveguide apparatus 100, according to an example. FIG. 1B illustrates a top view of a nanoparticle waveguide apparatus 100, according to another example. The nanoparticle waveguide apparatus 100 comprises a first optical waveguide 110 comprising a first nearfield-coupled nanoparticle (NCN) waveguide and a second optical waveguide 120. In some examples (e.g., as illustrated), the second optical waveguide 120 comprises an NCN waveguide. In other examples (not illustrated), the second optical waveguide 120 is a conventional optical waveguide. The second optical waveguide 120 is arranged adjacent to NCN waveguide of the first optical waveguide 110. In particular, the first and second optical waveguides 110, 120 are arranged adjacent to one another to cooperatively couple an optical signal 102 from an input 104 to an output 106 of the nanoparticle waveguide apparatus 100. By 'cooperatively couple' it is meant that the first and second optical waveguides 110, 120 cooperate with each other in some manner to facilitate the coupling. A particular nature of the facilitated coupling depends on a specific adjacent arrangement of the first and second optical waveguides 110, 120.

For example, the first and second optical waveguides 110, 120 may be arranged as a nanoparticle waveguide parallel coupler 100, as illustrated in FIG. 1A. In the parallel coupler 100, a portion of the NCN waveguide of the first waveguide 110 is arranged substantially parallel to and spaced apart from the second optical waveguide 120. As illustrated in FIG. 1A, the second optical waveguide 120 comprises the NCN waveguide. The parallel first and second optical waveguides 110, 120, enables the arrangement to cooperatively couple the optical signal 102 through an electromagnetic (EM) field interaction between the NCN waveguide portion of the first optical waveguide 110 and second optical waveguide 120 along an overlapping or parallel-coupled region P of the parallel coupler 100. Specifically, the optical signal 102 enters the parallel coupler 100 at an input 104. A portion of the optical signal 102 is coupled from the NCN waveguide of the first optical waveguide 110 to the second optical waveguide 120 (e.g., the NCN portion of the second optical waveguide 120) by the EM field coupling interaction. The coupled portion of the optical signal 102 then exits the parallel coupler 100 at the output port 106. Such parallel couplers 100 are sometimes referred to as directional couplers since the coupled portion of the optical signal is preferentially directed to the output port 106 as opposed to an opposite end of the second optical waveguide 120.

In another example illustrated in FIG. 1B, the first and second optical waveguides 110, 120 may be arranged as a nanoparticle waveguide Mach-Zehnder interferometer 100. In a Mach-Zehnder interferometer 100, a first end of the first optical waveguide 110 is connected to a first end of the second optical waveguide 120, for example. Further, a second end of the first optical waveguide 110 is connected to a second end of the second optical waveguide 120. The connected first ends may be the input port 104 and the connected second ends may be the output port 106 of the Mach-Zehnder interferometer 100, for example. As illustrated in FIG. 1B, the Mach-Zehnder interferometer 100 comprises NCN waveguides from the input port 104 to the output port 106, by way of example. However, in various other examples, portions of the first and second optical waveguides 110, 120 may comprise conventional optical waveguides (e.g., at the port 104, 106).

The two optical waveguides 110, 120 of the Mach-Zehnder interferometer 100 cooperatively couple the optical signal 102 from the input port 104 to the output port 106 according to a differential length of the two optical waveguides 110, 120. For example, when a portion of the optical signal 102 propagating in the NCN waveguide of the first optical waveguide 110 arrives at the output port 106 in phase with a portion of the optical signal 102 propagating in the second optical waveguide 120, the portions recombine in phase and exit the output port 106. In another example, when the portions arrive at the output port 106 with a 180-degree phase difference, the portions cancel one another and substantially no signal exits the optical port 106. Hence, the cooperative coupling is in terms of a differential path length of the adjacent first and second optical waveguides 110, 120.

As illustrated, the NCN waveguide of the first and second optical waveguides 110, 120 comprises a plurality of nanoparticles 112, 122 arranged in a row. An optical signal 102 propagating along the NCN waveguide is bound to individual ones of the nanoparticles 112, 122 in the plurality such that the propagating optical signal 102 effectively follows, or is guided by, the plurality of nanoparticles 112, 122 that make up the NCN waveguide. A heavy arrow in FIGS. 1A and 1B indicates a direction of propagation of the optical signal 102. As illustrated in FIG. 1A, the rows are straight by way of example. However, as defined herein, the term 'row' is intended to include within its scope a curved row (i.e., a curvilinear row), a branched row and a forked row, according to various other examples (not illustrated). For example, the rows in FIG. 1B are curved so that respective first ends and second ends of the two NCN waveguides of respective ones of the first and second optical waveguides 110, 120 may be connected together to form the Mach-Zehnder interferometer 100.

The nanoparticles 112, 122 have a major diameter of between about 10 nanometers (nm) and about 100 nm, according to some examples. Further in some examples, the nanoparticles 112, 122 are spaced apart from one another along an extent of the nanoparticle waveguide apparatus 100, as illustrated in FIGS. 1A and 1B. In some examples, a spacing or gap 108 between two immediately adjacent nanoparticles 112, 122 is less than about two times a major diameter (or four times a major radius) of the nanoparticles 112, 122. In some examples, the gap 108 is less than about 100 nm.

Note, that while illustrated as aligned and uniformly spaced by way of example in FIGS. 1A and 1B, respective nanoparticles 112, 122 of the first and second optical waveguides 110, 120 need be neither aligned with one another nor uniformly spaced apart, according to some examples. For example, nanoparticles 112 of the first optical waveguide 110 may be laterally offset from nanoparticles 122 of the second optical waveguide 120. A lateral offset of the nanoparticles 112, 122 produces a 'staggered' waveguide (not illustrated). Likewise in another example, nanoparticles 112 may be spaced closer together than nanoparticles 122. Staggered waveguides and non-uniform spacing may facilitate implementing filters, for example.

For example, if nanoparticles 112, 122 of an immediately adjacent pair each have a generally spherical shape with a diameter of about 10 nm, the gap 108 may be about 10 nm. A gap 108 of about 10 nm is less than about 20 nm or two times the major diameter of the spherically shaped nanoparticles 112, 122, for example. In another example, where the major diameter of two immediately adjacent nanoparticles 112, 122 is about 20 nm, the gap 108 may be about 5 nm.

In some examples, the gap 108 may vary along a length of the NCN waveguide of one or both of the first and second optical waveguides 110, 120 of the nanoparticle waveguide apparatus 100. Moreover, the gap 108 may vary even though a major diameter of the nanoparticles 112, 122 of the plurality is effectively constant. In other examples, the gap 108 may be effectively constant while a major diameter of the nanoparticles 112, 122 of the plurality varies. In yet other examples, the gap 108 between one or more of the nanoparticles 112, 122 of the plurality may be about 0 nm such that adjacent nanoparticles 112, 122 effectively touch one another.

Figure 2:
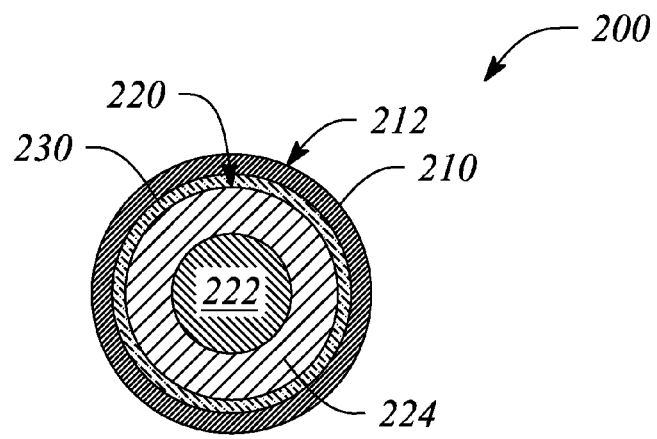
FIG. 2 illustrates a cross sectional view of a composite nanoparticle, according to an example.

In some examples, the plurality of nanoparticles 112, 122 of one or both of the first and second optical waveguides 110, 120 comprise a composite nanoparticle. FIG. 2 illustrates a cross sectional view of a composite nanoparticle 200, according to an example. In particular, the composite nanoparticle 200 has a spherical shape and the cross section is taken through a center of the spherically shaped composite nanoparticle 200, as illustrated in FIG. 2 by way of example. Moreover, while having a spherical shape as illustrated, the composite nanoparticle 200 of FIG. 2 may be considered illustrative of various features of many other composite nanoparticles when viewed in cross section through a center or central region thereof. In some examples, the composite nanoparticle 200 illustrated in FIG. 2 is an example of one or more nanoparticles 112, 122 in one or both of the first and second optical waveguides 110, 120 of the nanoparticle waveguide apparatus 100 illustrated in FIGS. 1A and 1B, for example.

As illustrated in FIG. 2, the composite nanoparticle 200 comprises a shell 210, a surface of which supports or is capable of supporting an optical signal. For example, the supported signal may be the optical signal 102 propagating along the nanoparticle waveguide apparatus 100 as illustrated in FIGS. 1A and 1B. Specifically, the optical signal is supported on a surface 212 of the shell 210. The shell 210 comprises a relatively thin layer of material when compared to the major radius of the composite nanoparticle 200. For example, the shell 210 may be between about 2 nm and 4 nm thick for a composite nanoparticle 200 having a major radius that is about 10 nm.

The shell 210 comprises a negative dielectric constant material (NDM). The NDM has a negative dielectric constant for at least one frequency within a frequency range of the optical signal, according to various examples. In some examples, the NDM comprises a metal or a metal alloy. For example, the metal may be copper (Cu). In some examples, the metal comprises a noble metal. For example, the noble metal may be either gold (Au) or silver (Ag). In other examples, the NDM comprises another material in addition to or instead of a metal. For example, the NDM may comprise a metamaterial.

The composite nanoparticle 200 further comprises a core 220. The core 220 is adjacent to a side of the shell 210 opposite the surface 212. The core 220 comprises an optical gain material (OGM). The OGM provides or is capable of providing optical gain to the optical signal through stimulated emission within the OGM. In particular, coupling between the optical signal and the OGM may induce the stimulated emission.

The core 220 of the composite nanoparticle 200 comprises a first layer 222. The first layer 222 comprises a first semiconductor material having a first bandgap. The core 220 further comprises a second layer 224. The second layer 224 comprises a second semiconductor material having a bandgap that is larger than the first bandgap. The second layer 224 is located between the first layer 222 and the shell 210. In particular, as illustrated for the generally spherical composite nanoparticle 200, the second layer 224 effectively surrounds the first layer 222. The first layer 222 and the second layer 224 collectively form the OGM of the core 220 that provides optical gain to the optical signal through stimulated emission. In some examples, the bandgap difference between the first layer 222 and the second layer 224 may enhance the stimulated emission by effectively forming a potential well, as is discussed in more detail above. A combined structure including the first layer 222 and the second layer 224 may be generally referred to as a quantum dot (QD).

By definition herein, semiconductor materials having band gaps that differ are assumed to comprise different materials unless otherwise specified. Specifically, the above-discussed bandgap differences between the first semiconductor material of the first layer 222 and the second semiconductor material of the second layer 224 are provided by different constituent materials in the first and second layers 222, 224, respectively.

In some examples, including the example illustrated in FIG. 2, the composite nanoparticle 200 further comprises an insulator layer 230. In some examples, the insulator layer 230 is located between the core 220 and the shell 210. The insulator layer 230, when present, electrically insulates the core 220 from the shell 210. In some examples, the insulator layer 230 comprises a dielectric material. For example, the insulator layer 230 may comprise an oxide or a nitride of a semiconductor of the core 220. In another example, the insulator layer 230 may comprise an undoped semiconductor (e.g., an intrinsic semiconductor). In other examples, the insulator layer 230 comprises a resistive material that allows some electric current to flow between the core 220 and the shell 210 (e.g., a lightly doped semiconductor).

Figure 3A:
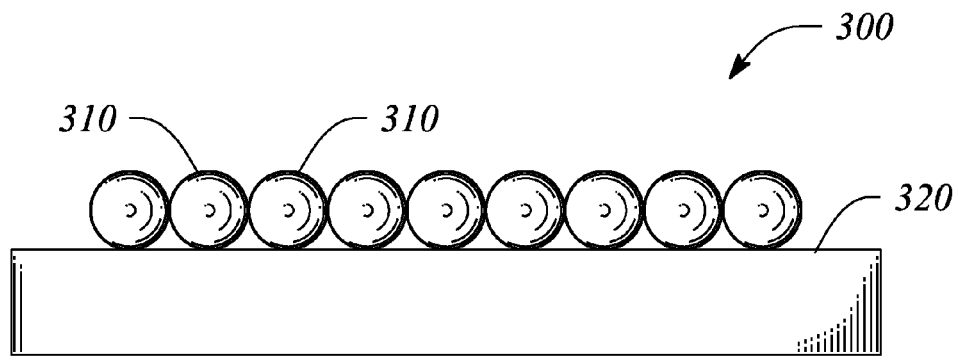
FIG. 3A illustrates a side view of a nearfield-coupled nanoparticle (NCN) waveguide, according to an example.

FIG. 3A illustrates a side view of a portion of an NCN waveguide 300, according to an example. The NCN waveguide portion 300 may be a portion of the NCN waveguide of one of the first optical waveguide 110 and the second optical waveguide 120, for example. In particular, the portion of the NCN waveguide 300 illustrated in FIG. 3A comprises a plurality of nanoparticles 310 situated on a surface of a substrate 320. In some examples, the substrate 320 comprises an insulator material. For example, the substrate 320 may be an insulator on semiconductor substrate comprising an insulator layer at a top surface of the substrate 320. The nanoparticles 310, as illustrated, have a spherical shape and may be effectively similar to the nanoparticles 112, 122 illustrated in FIGS. 1A and 1B, for example. Further, as illustrated in FIG. 3A, the nanoparticles 310 are touching one another and thus have a gap of about 0 nm between adjacent nanoparticles 310, by way of example. In some examples, one or more of the nanoparticles 310 may be composite nanoparticles. Composite nanoparticles may be substantially similar to the composite nanoparticle 200 illustrated in FIG. 2, for example.

Figure 3B:
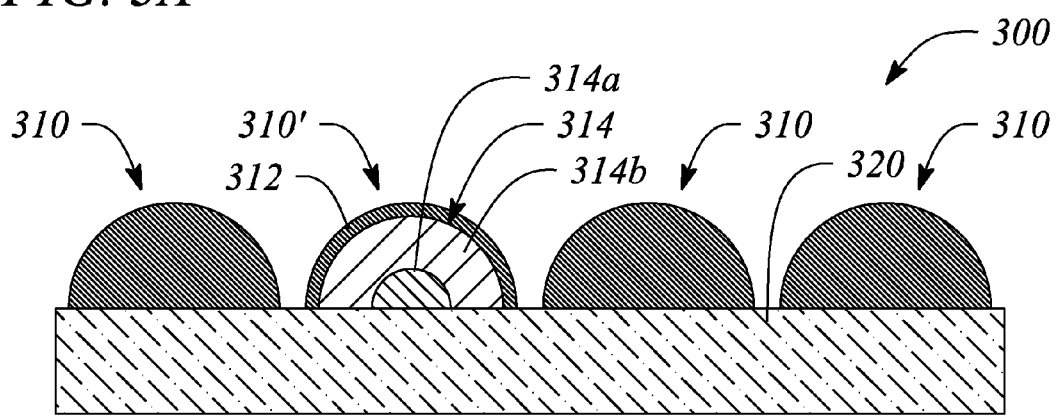
FIG. 3B illustrates a cross sectional view of a portion of an NCN waveguide, according to another example.

FIG. 3B illustrates a cross sectional view of a portion of an NCN waveguide 300, according to another example. In particular, the NCN waveguide portion 300 illustrated in FIG. 3B comprises a plurality of nanoparticles 310 situated on a surface of the substrate 320. The nanoparticles 310 of the plurality, as illustrated, have a hemispherical shape. One or more of the plurality of nanoparticles 310 may be a composite nanoparticle 310', as illustrated by way of example and not by way of limitation.

The composite nanoparticle 310' (also hemispherically shaped) comprises a shell 312 and a core 314. The core 314 comprises a first layer 314a and a second layer 314b. The first layer 314a is located at or near a center of the hemispherically shaped composite nanoparticle 310'. The second layer 314b is situated between the first layer 314a and the shell 312. The shell 312 is radially adjacent to the core 314. No insulator layer is present in the composite nanoparticles 310' illustrated in FIG. 3B, by way of example.

The shell 312 comprises an NDM (e.g., a metal) while the core 314 comprises an OGM. For example, the first layer 314a and the second layer 314b may comprise a first semiconductor and a second semiconductor, respectively. The first semiconductor may have a smaller or narrower bandgap than a bandgap of the second semiconductor, for example. Further, other hemispherically shaped nanoparticles 310 of the plurality that are not composite nanoparticles may comprise a material substantially similar to a material of the shell 312 throughout the entire nanoparticle 310, for example.

In some examples, the hemispherically shaped composite nanoparticle 310' may be similar to the composite nanoparticle 200 illustrated in FIG. 2, albeit cut in half, for example. Specifically, the first layer 314a and the second layer 314b may be effectively similar to the first layer 222 and the second layer 224 described above with respect to the composite nanoparticle 200, illustrated in FIG. 2. Likewise, the shell 312 may be effectively similar to the shell 210 of the composite nanoparticle 200.

Figure 3C:
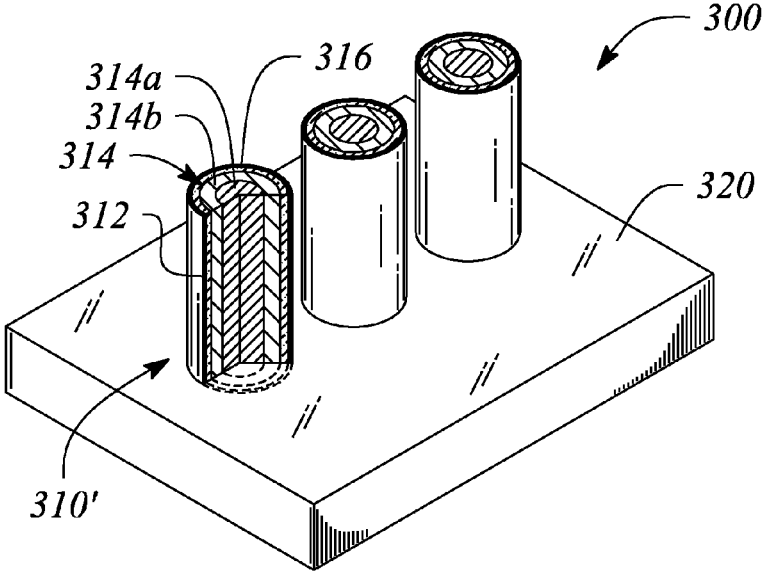
FIG. 3C illustrates a perspective view of a portion of an NCN waveguide, according to another example.

FIG. 3C illustrates a perspective view of a portion of an NCN waveguide 300, according to another example. In particular, the NCN waveguide portion 300 illustrated in FIG. 3C comprises a plurality of rod-shaped composite nanoparticles 310'. The NCN waveguide portion 300 further comprises a substrate 320. The rod-shaped composite nanoparticles 310' extend from a surface of the substrate 320 with one end attached to the substrate 320, as illustrated. For example, the rod-shaped composite nanoparticles 310' may be formed from or as core/shell nanowires grown or otherwise formed on the substrate 320.

Further as illustrated in FIG. 3C, one of the rod-shaped composite nanoparticles 310' is illustrated in longitudinal cross section to reveal interior structural details. The rod-shaped composite nanoparticles 310' comprise a generally rod-shaped core 314 surrounded by a shell 312. The core 314, in turn, comprises a first layer 314a surrounded by a second layer 314b. The first layer 314a and the second layer 314b may be similar to the first layer 222 and the second layer 224, respectively, described above with reference to the composite nanoparticle 200 illustrated in FIG. 2, according to some examples. Also illustrated, by way of example, is an insulator layer 316 between the second layer 314b and the shell 312.

Figure 4A:
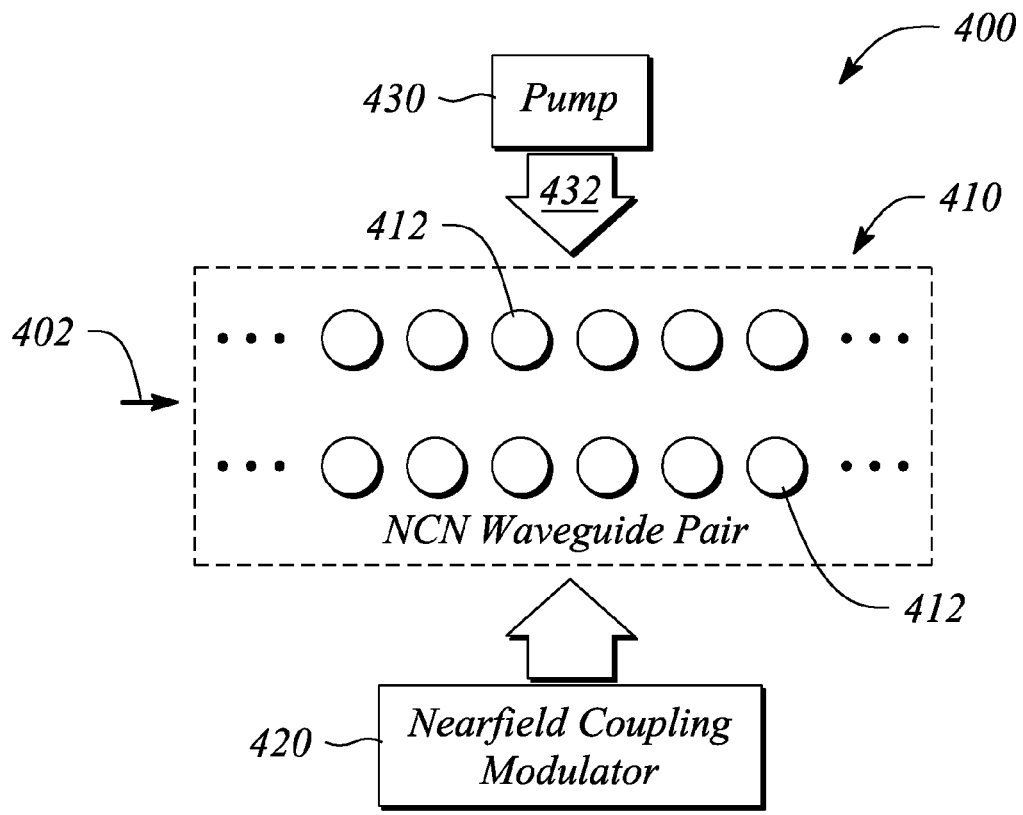
FIG. 4A illustrates a block diagram of a nanoparticle waveguide photonic system, according to an example.
Figure 4B:
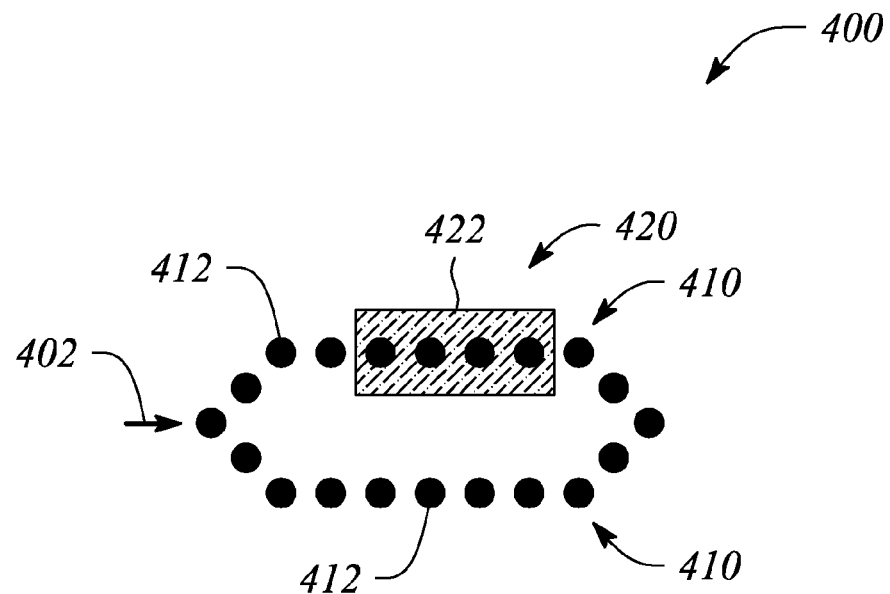
FIG. 4B illustrates a top view of a nanoparticle waveguide photonic system, according to an example.

FIG. 4A illustrates a block diagram of a nanoparticle waveguide photonic system 400, according to an example. FIG. 4B illustrates a top view of a nanoparticle waveguide photonic system 400, according to another example. As illustrated, the photonic system 400 comprises a pair of nearfield-coupled nanoparticle (NCN) waveguides 410. The NCN waveguides 410 of the pair are arranged relative to one another to cooperatively couple an optical signal 402 from an input to an output of the photonic system 400. Each NCN waveguide 410 of the pair comprises a plurality of negative dielectric constant material (NDM) nanoparticles 412 arranged adjacent to one another in a linear array. The NDM nanoparticles 412 of the pair of NCN waveguides 410 supports the optical signal 402 as the optical signal 402 propagates along an extent of the pair of NCN waveguides 410. In some examples, the pair of NCN waveguides 410 may be substantially similar to the nanoparticle waveguide apparatus 100, described above.

In some examples, at least one of the NDM nanoparticles 412 is a composite nanoparticle. The composite nanoparticles comprise a shell and a core (both not specifically illustrated in FIG. 4A or 4B). The core is adjacent to a side of the shell opposite a surface of the shell that supports or that is capable of supporting the propagating optical signal 402. The shell comprises a negative dielectric constant material (NDM). In some examples, the NDM is only at a surface of the shell. In some examples, the NDM comprises a metal. In some examples, the metal comprises a noble metal such as, but not limited to silver (Ag) or gold (Au). The core comprises an optical gain material (OGM). The OGM of the core provides or is capable of providing optical gain to the optical signal 402 through stimulated emission. In some examples, the NCN waveguide 410 is similar to the nanoparticle waveguide apparatus 100 described above with respect to FIGS. 1A and 1B. Further, the composite nanoparticle may be similar to any of the composite nanoparticles 200, 310 described above with respect to FIGS. 2 and 3A-3C, according to some examples.

The nanoparticle waveguide photonic system 400 further comprises a nearfield coupling (NC) modulator 420. The NC modulator 420 modulates a coupling between adjacent NDM nanoparticles 412 one or both of within and between the pair of NCN waveguides 410. In some examples, the NC modulator 420 is a means for modulating the nearfield coupling. Modulation of the coupling by the NC modulator 420 enables the nanoparticle waveguide photonic system 400 to serve as one or both of a photonic switch and a sensor that senses a change in an environment to which the nanoparticle waveguide photonic system 400 is exposed.

For example, a plurality of NDM nanoparticles 412 may be enclosed in a cavity 422 or similar structure that facilitates exposure of the enclosed NDM nanoparticles 412 to the environment (e.g., a microfluidic cavity with connectivity to the environment), as illustrated in FIG. 4B. The cavity 422 and the environment that may be introduced into the cavity 422 may serve as the NC modulator 420, for example.

In some examples, the NC modulator 420 comprises one or more composite nanoparticles. The composite nanoparticles modulate coupling by through a change in the gain provided by the OGM of the composite nanoparticle core. For example, the pair of NCN waveguides 410 may be arranged as a directional coupler. By changing a gain of the OGM (e.g., by using an external signal applied to the composite nanoparticles), the coupling between adjacent composite nanoparticles may be changed to modulate the optical signal 402.

The nanoparticle waveguide photonic system 400 further comprises a pump 430. The pump 430 is capable of providing energy 432 to pump the composite nanoparticle(s) of the plurality of NDM nanoparticles 412 of the NCN waveguide(s) 410. Pumping the composite nanoparticles, in turn, enables the stimulated emission that provides gain to the optical signal 402. The optical gain provided by pumping the composite nanoparticles may one or both of compensate for a propagation loss in the optical signal 402 and influence coupling between composite nanoparticles. For example, the coupling may be influenced by pumping the composite nanoparticles to effect a change in a plasma frequency of the shell. The influenced coupling may change a propagation path length of the optical signal 402 propagating along the NCN waveguide(s) 410 of the nanoparticle waveguide photonic system 400. Hence, the NC modulator 420 may further comprise the pump 430.

In some examples, the pump 430 comprises an optical pump 430. For example, the optical pump 430 may comprise a light source adjacent to the NCN waveguide 410. The light source based optical pump 430 provides optical energy that passes through the shell of the composite nanoparticles to induce population inversion and facilitate stimulated emission within the OGM of the core, for example. Effectively any optical pump used for producing lasers may be employed as the optical pump 430. For example, the optical pump 430 may comprise a laser arranged to illuminate the NCN waveguide 410.

In some examples, the pump 430 comprises an electrical pump 430. The electrical pump 430 may be an electrical voltage source or an electrical current source, for example. The electrical pump 430 may be connected to one of the composite nanoparticles, in some examples. For example, the electrical pump 430 may be connected to bias a semiconductor junction of the core. In other examples, the electrical pump 430 may be connected to both the core and the shell. For example, the shell may act as one of a pair of electrodes used to bias a semiconductor junction of the core and a first layer of the core may be directly contacted to act as the other electrode of the pair of electrodes to bias the semiconductor junction.

In some examples, the NC modulator 420 may comprise a means for changing one or both of a permittivity and a permeability of a medium in a space between the NDM nanoparticles 412 of the NCN waveguide 410. In particular, the space between the NDM nanoparticles 412 may be filled with a medium that exhibits a change in permittivity/permeability as a function of an applied, external signal, according to some examples. The external signal may be one or more of an electric field, a magnetic field and an electromagnetic signal (e.g., optical signal), according to various examples. For example, the NDM nanoparticles 412 may be immersed in an electro-optic medium that exhibits a change in permittivity as a function of an applied optical signal. Such a material may comprise metal particles coated with an electro-optic material, for example. A cavity 422 similar to that illustrated in FIG. 4B as part of the NC modulator 420 that surrounds only a portion of the NDM nanoparticles 412 may be employed, for example.

In another example, the NC modulator 420 may comprise an arrangement of quantum dots or other structures in a vicinity of a portion of the NCN waveguide 410. Activating the quantum dots or other structures may affect the nearfield coupling and provide the modulation. In yet other examples, one or both of a size and a relative spacing between the NDM nanoparticles 412 may be varied to realize the NC modulator 420.

In some examples, the NC modulator 420 comprises a portion of the NCN waveguide 410 that is exposed to a medium (e.g., a fluid or a gas) that contains or may contain an analyte (e.g., via a cavity, such as the cavity 422 illustrated in FIG. 4B). The presence, and possibly a concentration, of the analyte in the medium may affect the coupling between the NDM nanoparticles 412 of the NCN waveguide 410 (e.g., through a dielectric response). For example, one or both of the permittivity and the permeability in the space between the NDM nanoparticles 412 may be changed by the presence of the analyte. In other words, the NC modulator 420 comprises the analyte in a vicinity of a portion of the NCN waveguide 410. In such examples, the nanoparticle waveguide photonic system 400 may be used as a sensor to detect and even quantify the analyte. In some examples, one or more of the NDM nanoparticles 412 may be functionalized. Functionalizing may provide selective or preferential binding of particular analytes. Preferential binding may increase a sensitivity of the nanoparticle waveguide photonic system 400 when employed as a sensor, for example.

Figure 5:
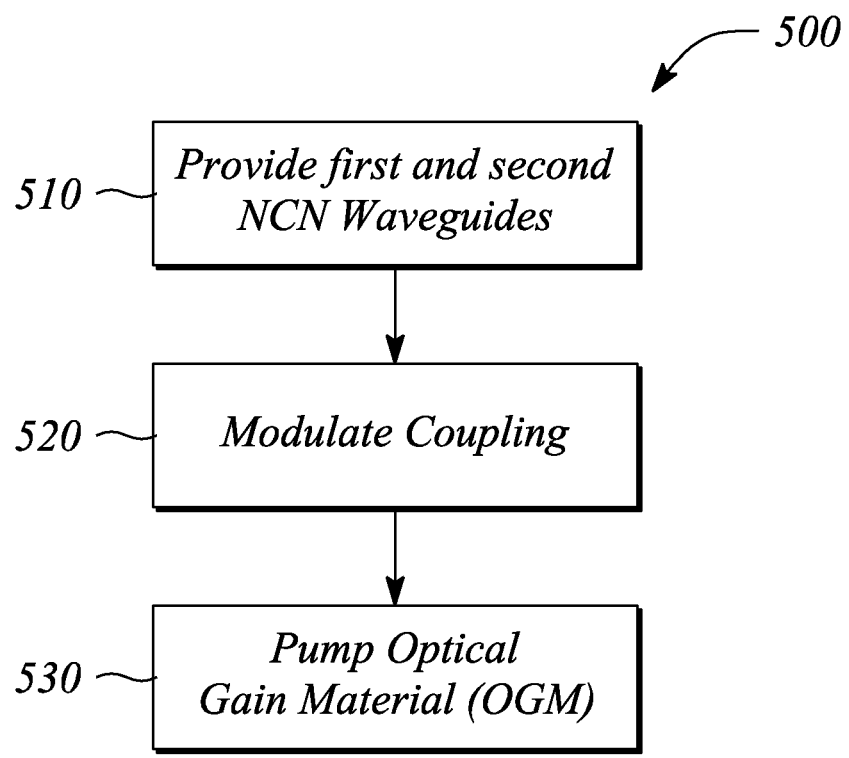
FIG. 5 illustrates a flow chart of a method of photonic transmission, according to an example.

FIG. 5 illustrates a flow chart of a method 500 of photonic transmission, according to an example. The method 500 of photonic transmission comprises providing 510 a first nearfield-coupled nanoparticle (NCN) waveguide and a second NCN waveguide. Each NCN waveguide comprises a plurality of nanoparticles arranged adjacent to one another. Further, the first and second NCN waveguides are arranged (i.e., relative to one another) to cooperatively transmit an optical signal from an input port to an output port.

In some examples, at least one of the nanoparticles in one or both of the NCN waveguides is a composite nanoparticle. The composite nanoparticle comprises a shell. The shell comprises a negative dielectric constant material (NDM), wherein a surface of the shell NDM supports the optical signal. The composite nanoparticle further comprises a core adjacent to a side of the shell opposite to the surface of the shell. The core comprises an optical gain material (OGM). In various examples, the provided 510 first and second NCN waveguides are substantially similar to the NCN waveguide of the nanoparticle waveguide apparatus 100 described above with respect to FIGS. 1A and 1B. Further, the composite nanoparticle may be substantially similar to any of the composite nanoparticles 200, 310 described above with respect to FIGS. 2 and 3A-3C, according to various examples.

In some examples, providing 510 the first and second NCN waveguides comprises providing the plurality of nanoparticles, wherein each of the nanoparticles has a major diameter between about 10 nm and 100 nm. Providing 510 the first and second NCN waveguides may further comprise arranging the provided plurality of nanoparticles adjacent to one another in a row, as described above. In some examples, the nanoparticles of the plurality are spaced apart from one another in the row by a gap that is less than about twice a largest major diameter of the nanoparticles in the plurality. In other examples, the nanoparticles are arranged such that they physically contact adjacent ones of the nanoparticles in the row. The nanoparticles may be arranged in the row on a substrate, for example.

The method 500 of photonic transmission further comprises modulating 520 a coupling between one or both of first and second NCN waveguides and adjacent nanoparticles within one or both of the first and second NCN waveguides. Modulating 520 a coupling modulates a characteristic of the optical signal that is cooperatively transmitted. For example, the modulated 520 characteristic may be a phase of the transmitted optical signal. In another example, the modulated 520 characteristic may be an amplitude of the transmitted optical signal. In yet another example, modulating 520 a coupling may affect a characteristic such as a plasma frequency of the nanoparticles that, in turn, affects a frequency of an optical signal that is supported by the NCN waveguides. In other words, modulating 520 a coupling modulates a characteristic that may be a frequency of the transmitted optical signal in terms of what frequency the optical signal can have and still be the transmitted optical signal. Modulating 520 a coupling one or both of switches the transmitted optical signal (e.g., from one path to another) and senses a change (e.g., in a concentration of an analyte) in an environment to which a portion of the NCN waveguides is exposed.

As employed, the transmitted optical signal is a signal that propagates or is capable of propagating along the NCN waveguide. Propagation of the optical signal comprises coupling the optical signal onto a first one of the nanoparticles of the NCN waveguide, for example. Propagation of the optical signal further comprise coupling the optical signal from the first one of the nanoparticles to a second nanoparticle and so on such that the transmitted optical signal is further coupled between successive adjacent ones of the nanoparticles along the NCN waveguide. Coupling the optical signal may be facilitated by spacing adjacent composite nanoparticles by the gap that is less than about twice the largest major diameter of the nanoparticles in the plurality that make up the NCN waveguide.

In some examples, the method 500 of photonic transmission further comprises pumping 530 the OGM of the composite nanoparticle(s) to facilitate stimulated emission within the OGM. In some examples, pumping 530 the OGM comprises optical pumping. In other examples, pumping 530 the OGM comprises electrical pumping. In yet other examples, pumping 530 the OGM may comprise both optical pumping and electrical pumping.

Thus, there have been described examples of a nanoparticle waveguide apparatus, a nanoparticle waveguide photonic system and a method of photonic transmission that employ nearfield-coupled nanoparticle waveguides. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A nanoparticle waveguide apparatus comprising:
a first optical waveguide comprising a nearfield-coupled nanoparticle (NCN) waveguide having a plurality of nanoparticles;
a second optical waveguide arranged adjacent to the NCN waveguide of the first optical waveguide to cooperatively couple an optical signal from an input to an output of the nanoparticle waveguide apparatus; and
a nearfield coupling (NC) modulator to modulate a nearfield coupling between the first optical waveguide and the second optical waveguide to one of facilitate and prohibit coupling of the optical signal from the input to the output of the nanoparticle waveguide apparatus via the first and second optical waveguides.

2. The nanoparticle waveguide apparatus of claim 1, wherein one or more nanoparticles in the plurality of nanoparticles of the NCN waveguide are composite nanoparticles.

3. The nanoparticle waveguide apparatus of claim 2, wherein a composite nanoparticle comprises:
   a shell comprising a negative dielectric constant material (NDM) to support the optical signal at a surface of the shell; and
   a core adjacent to a side of the shell opposite to the shell surface the core comprising an optical gain material (OGM) to provide optical gain to the optical signal through stimulated emission within the OGM.

4. The nanoparticle waveguide apparatus of claim 1, wherein the second optical waveguide comprises an NCN waveguide having a plurality of nanoparticles.

5. The nanoparticle waveguide apparatus of claim 4, wherein a portion of the NCN waveguide of the first optical waveguide is arranged substantially parallel to and spaced apart from a portion of the NCN waveguide of the second optical waveguide to form a directional coupler, the first optical waveguide being the input and the second optical waveguide being the output of the nanoparticle waveguide apparatus and, wherein the optical signal is cooperatively coupled between the substantially parallel and spaced apart portions of the NCN waveguides.

6. The nanoparticle waveguide apparatus of claim 1, wherein a first end of the NCN waveguide of the first optical waveguide is connected to a first end of the second optical waveguide and a second end of the NCN waveguide of the first optical waveguide is connected to a second end of the second optical waveguide to form a Mach-Zehnder interferometer, the respective first ends being the input and the respective second ends being the output of the nanoparticle waveguide apparatus.

7. The nanoparticle waveguide apparatus of claim 1, wherein nanoparticles of a plurality of nanoparticles of the NCN waveguide are spaced apart from one another by a gap that is less than about two times a major diameter of the nanoparticles a nanoparticle of the plurality having a major diameter of between about 10 nanometers and about 100 nanometers.

8. The nanoparticle waveguide apparatus of claim 1, wherein the NC modulator comprises a plurality of adjacent nanoparticles within the NCN waveguide that are immersed in an analyte-carrying fluid, wherein changes in constituent properties of the analyte-carrying fluid influence a strength of the nearfield coupling between the adjacent nanoparticles of the plurality.

9. A nanoparticle waveguide photonic system comprising:
   a pair of nearfield-coupled nanoparticle (NCN) waveguides arranged relative to one another to cooperatively couple an optical signal from an input to an output of the nanoparticle waveguide photonic system, each NCN waveguide of the pair comprising a plurality of negative dielectric constant material (NDM) nanoparticles arranged adjacent to one another in a linear array; and
   a nearfield coupling (NC) modulator to modulate a coupling between the adjacent NDM nanoparticles between the pair of NCN waveguides to one of facilitate and prohibit coupling of the optical signal from the input to the output of the nanoparticle waveguide photonic system via the pair of optical waveguides.

10. The nanoparticle waveguide photonic system of claim 9, wherein at least one of the NDM nanoparticles of the plurality is a composite nanoparticle the composite nanoparticle comprising a shell of negative dielectric constant material (NDM) and a core of an optical gain material (OGM), the core being adjacent to a side of the shell opposite a surface of the shell and wherein the NC modulator comprises the composite nanoparticle.

11. The nanoparticle waveguide photonic system of claim 10, further comprising a pump to provide energy to pump and stimulate emission within the OGM core of the composite nanoparticle.

12. The nanoparticle waveguide photonic system of claim 9, wherein a first end of a first NCN waveguide of the pair is connected to a first end of a second NCN waveguide of the pair and a second end of the first NCN waveguide is connected to a second end of the second NCN waveguide to form a Mach-Zehnder interferometer, the connected first ends being the input and the connected second ends being the output of the nanoparticle waveguide photonic system and wherein the NC modulator comprises a portion of one of the first and second NCN waveguides of the pair.

13. A method of photonic transmission, the method comprising:
   providing a first nearfield-coupled nanoparticle (NCN) waveguide and a second NCN waveguide, the first and second NCN waveguides each comprising a plurality of nanoparticles arranged adjacent to one another, wherein the first and second NCN waveguides are arranged to cooperatively transmit an optical signal from an input port to an output port; and
   modulating a coupling between the first and second NCN waveguides and the adjacent nanoparticles of the respective plurality to modulate a propagation characteristic of the optical signal.

14. The method of photonic transmission of claim 13, wherein at least one of the nanoparticles of the plurality is a composite nanoparticle, the method further comprising:
   pumping the composite nanoparticle within one or both of the first and second NCN waveguides, the pumping providing energy to stimulate emission within an optical gain material (OGM) of the composite nanoparticle, the composite nanoparticle comprising:
   a shell comprising a negative dielectric constant material (NDM), a surface of the shell NDM to support the optical signal; and
   a core adjacent to a side of the shell opposite the shell surface, the core comprising the optical gain material (OGM), wherein the stimulated emission is to provide optical gain to the optical signal.

* * * * *